(12) United States Patent
Lim

(10) Patent No.: US 10,412,821 B1
(45) Date of Patent: Sep. 10, 2019

(54) DUAL SIDE COOLING STRUCTURE

(71) Applicant: Delta Electronics Int'l (Singapore) Pte Ltd, Singapore (SG)

(72) Inventor: Beng Beng Lim, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/041,564

(22) Filed: Jul. 20, 2018

(30) Foreign Application Priority Data

Jun. 21, 2018 (SG) .......................... 10201805356.X

(51) Int. Cl.
| | |
|---|---|
| *H05K 1/02* | (2006.01) |
| *H05K 1/18* | (2006.01) |
| *H05K 3/34* | (2006.01) |
| *H05K 3/32* | (2006.01) |
| *H05K 3/30* | (2006.01) |

(52) U.S. Cl.
CPC .......... *H05K 1/0209* (2013.01); *H05K 1/021* (2013.01); *H05K 1/181* (2013.01); *H05K 1/185* (2013.01); *H05K 3/305* (2013.01); *H05K 3/321* (2013.01); *H05K 3/3431* (2013.01)

(58) Field of Classification Search
CPC ...... H05K 1/0209; H05K 1/021; H05K 1/181; H05K 3/305; H05K 3/321; H05K 3/3431; H05K 1/0201; H05K 1/0203; H05K 1/0204
USPC .......................................... 174/252; 361/719
See application file for complete search history.

(56) References Cited

U.S. PATENT DOCUMENTS

2016/0233140 A1* 8/2016 Lai .......................... H01L 24/02

* cited by examiner

*Primary Examiner* — Robert J Hoffberg
*Assistant Examiner* — Hung Q Dang
(74) *Attorney, Agent, or Firm* — Kirton McConkie; Evan R. Witt

(57) ABSTRACT

A package structure includes an insulation layer, an electronic component, at least one thermal conduction structure, a first re-distribution block and a heat dissipation device. The electronic component is embedded within the insulation layer, and comprises a first surface exposed from a top surface of the insulation layer, a second surface and plural conducting terminals formed on the second surface. The at least one thermal conduction structure is embedded within the insulation layer and partially exposed from the top surface of the insulation layer. One part of the first re-distribution block is disposed on a bottom surface of the insulation layer, and the other part of the first re-distribution block is located in the insulation layer and connected with the at least one thermal conduction structure and at least one of the conducting terminals. The heat dissipation device is mounted onto the first surface of the electronic component.

8 Claims, 3 Drawing Sheets

DUAL SIDE COOLING STRUCTURE

FIELD OF THE INVENTION

The present invention relates to a package structure, and more particularly to a package structure capable of enhancing the heat dissipating efficiency and achieving compact purposes.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes and transistors) are integrated as a power module, the power module may be installed on a motherboard or a system circuit board.

However, the conventional package structure of the power module often has bad heat dissipating efficiency when the electronic component embedded within an insulation layer of the conventional package structure of the power module generates a large of heat during working.

SUMMARY OF THE INVENTION

An object of the present invention is to provide a package structure having an insulation layer, an electronic component embedded within the insulation layer and a heat dissipation device, wherein a first surface of the electronic component is directly in contact with the heat dissipation device. Consequently, the package structure can enhance the heat dissipating efficiency. In addition, an inductor is disposed over the heat dissipation device so that a compact package structure is provided.

In accordance with an aspect of the present invention, there is provided a package structure. The package structure includes an insulation layer, an electronic component, at least one thermal conduction structure, at least one first re-distribution block and a heat dissipation device. The electronic component is embedded within the insulation layer, and comprises a first surface, a second surface opposite to the first surface and plural conducting terminals formed on the second surface of the electronic component. The first surface of the electronic component is exposed from the insulation layer and coplanar with a top surface of the insulation layer. The at least one thermal conduction structure is embedded within the insulation layer. The at least one thermal conduction structure is exposed from the insulation layer and coplanar with the top surface of the insulation layer. One part of the at least one first re-distribution block is disposed on a bottom surface of the insulation layer, and the other part of the at least one first re-distribution block is located in the insulation layer and connected with the at least one thermal conduction structure and at least one of the plural conducting terminals. The heat dissipation device is disposed on the top surface of the insulation layer and mounted onto the first surface of the electronic component.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
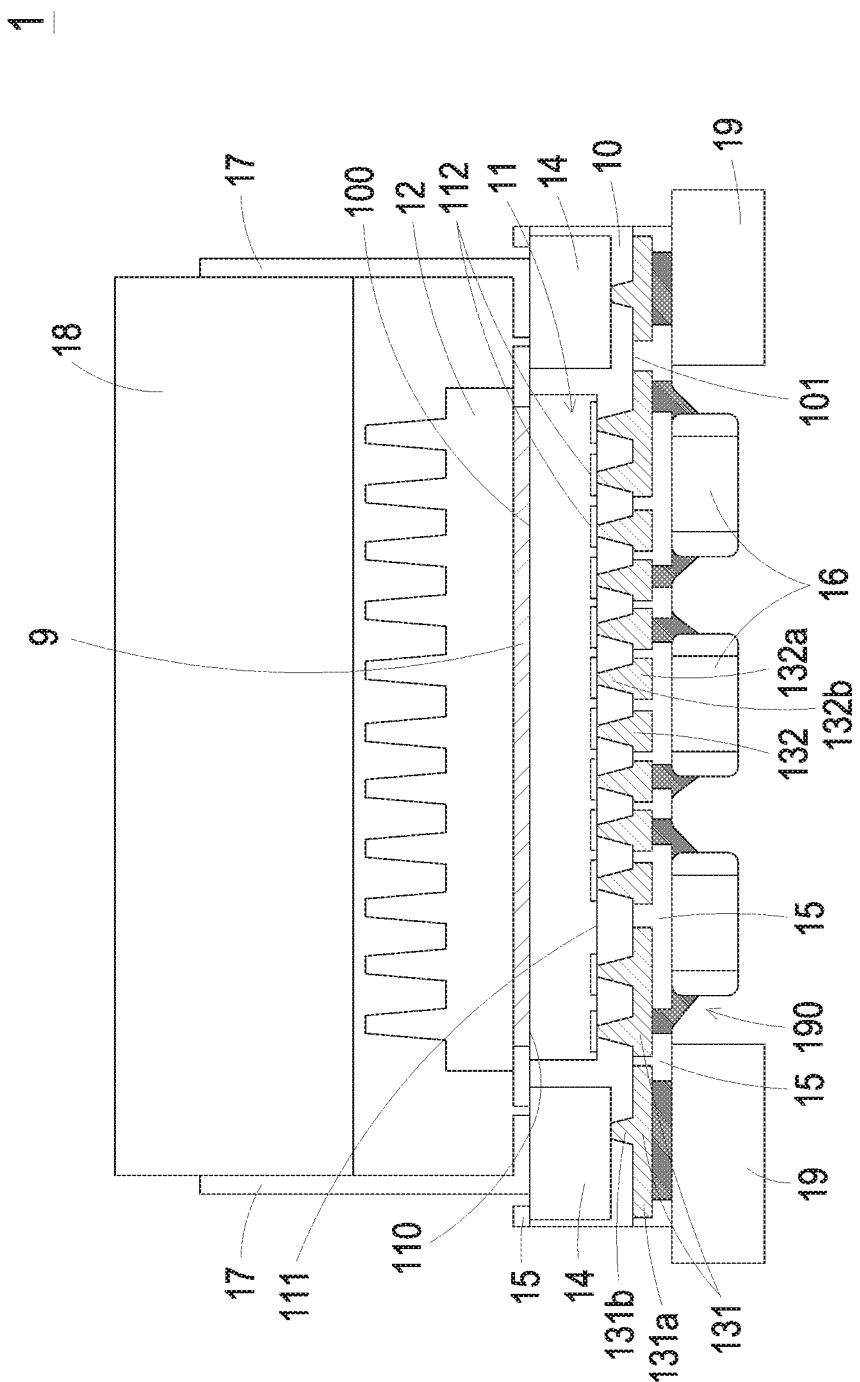
FIG. 1 is a schematic cross-sectional view illustrating a package structure according to a first embodiment of the present invention.
Figure 2:
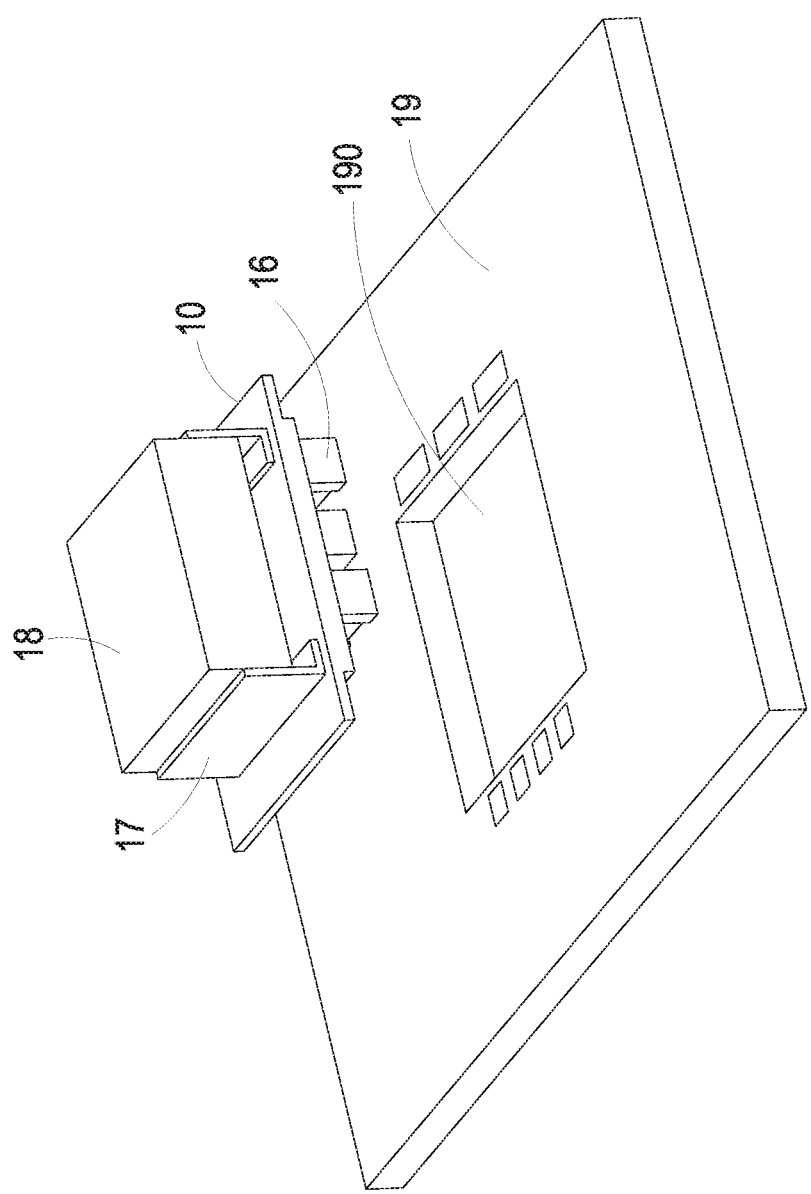
FIG. 2 is a schematic exploded view illustrating the package structure of FIG. 1.

FIG. 1 is a schematic cross-sectional view illustrating a package structure according to a first embodiment of the present invention. FIG. 2 is a schematic exploded view illustrating the package structure of FIG. 1. As shown in FIGS. 1 and 2, the package structure 1 (hereinafter also referred to as dual side cooling structure) comprises an insulation layer 10, an electronic component 11, a heat dissipation device 12, at least one first re-distribution block 131, and at least one thermal conduction structure 14. The insulation layer 10 can be made of any appropriate insulation material with high thermal conductivity.

The electronic component 11 is an active component, such as a chip of a power semiconductor device. The electronic component 11 is embedded within the insulation layer 10 by a thermal compression bonding process, and comprises a first surface 110, a second surface 111 opposite to the first surface 110 and plural conducting terminals 112. The first surface 110 of the electronic component 11 is uncovered by the insulation layer 10, exposed from the insulation layer 10 and coplanar with a top surface 100 of the insulation layer 10. The plural conducting terminals 112 are formed on the second surface 111 of the electronic component 11.

At least one thermal conduction structure 14 is embedded within the insulation layer 10 and surrounds lateral sides of the electronic component 11. In this embodiment, the package structure 1 comprises two thermal conduction structures 14 located at the horizontal both sides of the electronic component 11. Moreover, each of the thermal conduction structures 14 is exposed from the insulation layer 10 and coplanar with the top surface 100 of the insulation layer 10. Consequently, the heat generated by the electronic component 11 may be transferred to the surroundings of the package structure 1 through the thermal conduction structure 14. In addition, the overall strength of the package structure 1 can be enhanced by the thermal conduction structure 14. In this embodiment, each of the thermal conduction structure 14 is implemented by a metallic lead frame. In some other embodiments, each of the thermal conduction structures 14 is implemented by a pre-preg material or a ceramic substrate with a good thermally conductive property.

One part of the at least one first re-distribution block 131 is disposed on the bottom surface 101 of the insulation layer 10, and the other part of the first re-distribution block 131 is located in the insulation layer 10 and connected with the at least one thermal conduction structure 14 and the corresponding conducting terminal 112 (not shown in FIG. 1). In this embodiment, one part of the conducting terminal 112 is connected with the thermal conducting structure 14 through the first re-distribution block 131. In this embodiment, the package structure 1 further comprises at least one second re-distribution block 132. One part of the at least one second re-distribution block 132 is disposed on the bottom surface 101 of the insulation layer 10, and the other part of the at least one second re-distribution block 132 is located in the insulation layer 10 and connected with a corresponding conducting terminal 112. Moreover, in this embodiment, each of the first re-distribution block 131 and the second re-distribution block 132 comprises a re-distribution layer 131a, 132a (also referred as RDL) and at least one conductive via 131b, 132b. The re-distribution layer 131a, 132a is disposed on the bottom surface 101 of the insulation layer 10. Besides, the at least one conductive via 131b, 132b is formed in the insulation layer 10 and in contact with the corresponding re-distribution layer 131a, 132a. Furthermore, each of the thermal conduction structures 14 is connected with the corresponding conductive via 131b of the first re-distribution block 131, and at least one of the conducting terminals 112 of the electronic component 11 is connected with the corresponding conductive via 131b of the first re-distribution block 131. Accordingly, the at least one thermal conduction structure 14 is electrically connected with the at least one of the conducting terminals 112 of the electronic component 11 through the conductive via 131b and the re-distribution layer 131a of the first re-distribution block 131.

The heat dissipation device 12 is disposed on the top surface 100 of the insulation layer 10 and mounted onto the first surface 110 of the electronic component 11 for enhancing the heat dissipating efficiency of the package structure 1. The heat dissipation device 12 may be a passive heat dissipation device or an active heat dissipation device. An example of the passive heat dissipation device includes but not limited to a heat sink made of metallic material or ceramic material. An example of the active heat dissipation device includes but not limited to heat pipe. In some embodiments, the heat dissipation device 12 can be fixed on the top surface 100 of the insulation layer 10 or the first surface 110 of the electronic component 11 by heat conduction glue 9.

As mentioned above, since the heat dissipation device 12 is mounted onto the first surface 110 of the electronic component 11, even if the electronic component 11 generates a large of heat during working, the heat generated by the electronic component 11 can be quickly transferred to the surroundings of the package structure 1 through the heat dissipation device 12. Besides, a portion of the heat generated by the electronic component 11 also can be transferred to the bottom surface 101 of the insulation layer 10 and the thermal conduction structures 14 through the re-distribution layers 131a, 132a and the conductive vias 131b, 132b.

In some embodiments, as shown in FIG. 1, the package structure 1 further comprises plural mounting parts 15. Some of the mounting parts 15 are disposed on the top surface 100 of the insulation layer 10, and the other of the mounting parts 15 are disposed on the bottom surface 101 of the insulation layer 10. The plural mounting parts 15 are made of any appropriate insulation material. Each of the mounting parts 15 can be used to mount a passive element and/or print the solder.

In addition, the package structure 1 further comprises at least one passive component 16, for example but not limited to three passive components 16 (see FIG. 1). The passive components 16 are respectively disposed and fixed on the corresponding mounting parts 15 disposed on the bottom surface 101 of the insulation layer 10 by soldering. Furthermore, as shown in FIG. 1, the package structure 1 comprises at least two support parts 17 and an inductor 18. The at least two support parts 17 are made of metallic materials. One terminal of each of the at least two support parts 17 is disposed on the top surface 100 and is in contact with the corresponding thermal conduction structure 14, and the other terminal of each of the at least two support parts 17 is configured to support and fix one side of the inductor 18. Consequently, the inductor 18 is disposed over the insulation layer 10 and between the at least two support parts 17. Besides, the passive components 16, the inductor 18 and at least one of the conducting terminals 112 of the electronic component 11 are electrically connected with each other through the re-distribution layer 131a and the at least one conductive via 131b of the first re-distribution block 131 and the thermal conduction structure 14. In some embodiments, the height of each of the at least two support parts 17 is higher than that of the heat dissipation device 12, so that the heat dissipation device 12 is located between the inductor 18 and the insulation layer 10. Moreover, the package structure 1 includes but is not limited to buck functionality by setting the passive components 16 and the inductor 18.

In other embodiments, as shown in FIG. 1, the package structure 1 further comprises a printed circuit board 19. The printed circuit board 19 is disposed and fixed on the bottom surface 101 of the insulation layer 10 by soldering. In addition, the printed circuit board 19 comprises an opening 190. The position of the opening 190 is corresponding to the position of the at least one passive component 16. When the printed circuit board 19 is disposed and fixed on the bottom surface 101, the at least one passive component 16 is buried in the opening 190 for reducing the height of the package structure 1.

Figure 3:
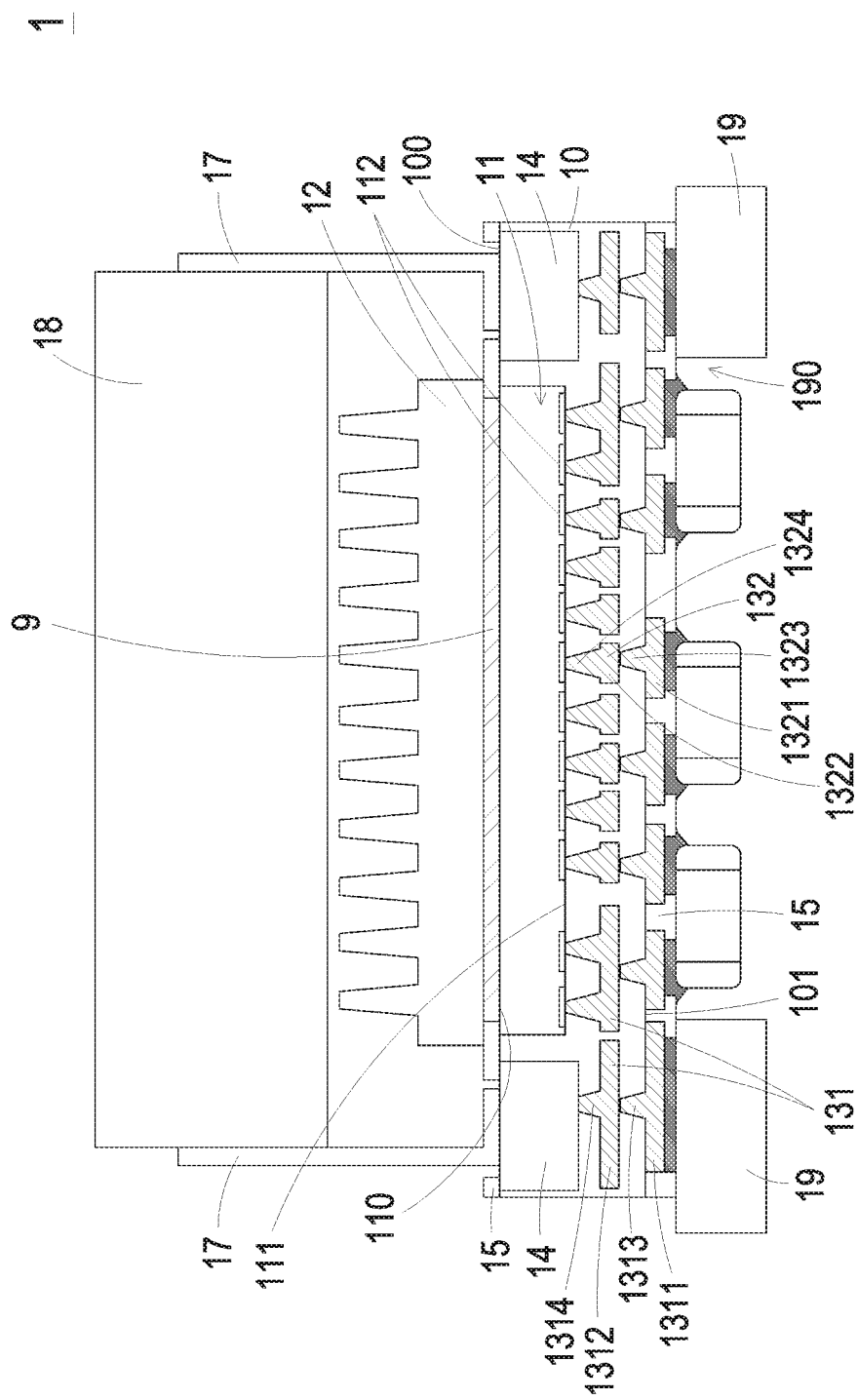
FIG. 3 is a schematic cross-sectional view illustrating a package structure according to a second embodiment of the present invention.

FIG. 3 is a schematic cross-sectional view illustrating a package structure according to a second embodiment of the present invention. In comparison with the first embodiment shown in FIG. 1, the first re-distribution block 131 comprises a first re-distribution layer 1311, a second re-distribution layer 1312, at least one first conductive via 1313 and at least one second conductive via 1314. The first re-distribution layer 1311 is disposed on the bottom surface 101 of the insulation layer 10. The second re-distribution layer 1312 is horizontally formed in the insulation layer 10 and between the electronic component 11 and the first re-distribution layer 1311. The at least one first conductive via 1313 is formed in the insulation layer 10 and between the first re-distribution layer 1311 and the second re-distribution layer 1312, and the at least one first conductive via 1313 is in contact with the first re-distribution layer 1311 and the second re-distribution layer 1312. The at least one second conductive via 1314 is formed in the insulation layer 10. In this embodiment, the at least one second conductive via 1314 comprises plural second conductive vias 1314. Some of the second conductive vias 1314 are between the second re-distribution layer 1312 and the electronic component 11, and are connected with the second re-distribution layer 1312 and at least one of the conducting terminals 112 of the electronic component 11. The other of the second conductive vias 1314 are between the second re-distribution layer 1312 and the corresponding thermal conduction structure 14, and are connected with the second re-distribution layer 1312 and the corresponding thermal conduction structure 14. The passive component 16, the inductor 18 and the at least one of the conducting terminals 112 of the electronic component 11 are electrically connected with each other through the first re-distribution layer 1311, the second re-distribution layer 1312, the at least one first conductive via 1313 and the at least one second conductive via 1314.

In addition, the second re-distribution block 132 comprises a first re-distribution layer 1321, a second re-distribution layer 1322, at least one first conductive via 1323 and at least one second conductive via 1324. The first re-distribution layer 1321 is disposed on the bottom surface 101 of the insulation layer 10. The second re-distribution layer 1322 is horizontally formed in the insulation layer 10 and between the electronic component 11 and the first re-distribution layer 1321. The at least one first conductive via 1323 is formed in the insulation layer 10 and between the first re-distribution layer 1321 and the second re-distribution layer 1322, and the at least one first conductive via 1323 is in contact with the first re-distribution layer 1321 and the second re-distribution layer 1322. The at least one second conductive via 1324 is formed in the insulation layer 10. In this embodiment, the at least one second conductive via 1324 is between the second re-distribution layer 1322 and the electronic component 11, and is connected with the second re-distribution layer 1322 and one of the conducting terminals 112 of the electronic component 11.

From the above descriptions, the present invention provides a package structure. The heat dissipation device is directly in contact with the first surface of the electronic component. Consequently, the heat generated by the electronic component can be directly transferred to the surroundings of the package structure through the heat dissipation device. Besides, a portion of the heat generated by the electronic component also can be transferred to the bottom surface of the insulation layer and the thermal conduction structures through the re-distribution blocks. Consequently, the heat dissipating efficacy of the package structure is largely enhanced. In addition, an inductor is disposed over the heat dissipation device so that a compact package structure is provided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
   an insulation layer;
   an electronic component embedded within the insulation layer, and comprising a first surface, a second surface opposite to the first surface and plural conducting terminals formed on the second surface of the electronic component, wherein the first surface of the electronic component is exposed from the insulation layer and coplanar with a top surface of the insulation layer;
   at least one thermal conduction structure embedded within the insulation layer, wherein the at least one thermal conduction structure is exposed from the insulation layer and coplanar with the top surface of the insulation layer; and
   a first re-distribution block, wherein one part of the first re-distribution block is disposed on a bottom surface of the insulation layer, and the other part of the first re-distribution block is located in the insulation layer and connected with the at least one thermal conduction structure and at least one of the plural conducting terminals; and
   a heat dissipation device disposed on the top surface of the insulation layer and mounted onto the first surface of the electronic component;
   wherein the at least one thermal conduction structure surrounds lateral sides of the electronic component;
   wherein the package structure comprises plural mounting parts, wherein some of the mounting parts are disposed on the top surface of the insulation layer, and the other of the mounting parts are disposed on the bottom surface of the insulation layer.

2. The package structure according to claim 1, wherein the first re-distribution block comprises a re-distribution layer and at least one conductive via, the re-distribution layer is disposed on the bottom surface of the insulation layer, the at least one conductive via is formed in the insulation layer and in contact with the re-distribution layer, wherein the thermal conduction structure is connected with the corresponding conductive via, and at least one of the plural conducting terminals of the electronic component is connected with the corresponding conductive via.

3. The package structure according to claim 1, wherein the heat dissipation device is fixed on the top surface or the first surface of the electronic component by a heat conduction glue.

4. The package structure according to claim 1, further comprising at least one passive component, wherein the at least one passive component is disposed and fixed on the corresponding mounting part disposed on the bottom surface of the insulation layer by soldering.

5. The package structure according to claim 4, further comprising at least two support parts and an inductor, wherein the at least two support parts are made of metallic materials, one terminal of each of the at least two support parts is disposed on the top surface and in contact with the corresponding thermal conduction structure, and the other terminal of each of the at least two support parts is configured to support and fix one side of the inductor, wherein the at least one passive component, the inductor and the at least one of the plural conducting terminals of the electronic component are electrically connected with each other through the first re-distribution block and the thermal conduction structure.

6. The package structure according to claim 5, wherein the height of each of the at least two support parts is higher than that of the heat dissipation device, and the heat dissipation device is located between the inductor and the insulation layer.

7. The package structure according to claim 4, further comprising a printed circuit board disposed and fixed on the bottom surface of the insulation layer by soldering, wherein the printed circuit board comprises an opening, the position of the opening is corresponding to the position of the at least one passive component, and the at least one passive component is buried in the opening.

8. The package structure according to claim 1, wherein the first re-distribution block comprises:

a first re-distribution layer disposed on the bottom surface of the insulation layer;

a second re-distribution layer horizontally formed in the insulation layer and between the electronic component and the first re-distribution layer;

at least one first conductive via formed in the insulation layer and between the first re-distribution layer and the second re-distribution layer, wherein the at least one first conductive via is in contact with the first re-distribution layer and the second re-distribution layer; and plural second conductive vias formed in the insulation layer, wherein some of the second conductive vias are between the second re-distribution layer and the electronic component and connected with the second re-distribution layer and the corresponding conducting terminal of the electronic component, and the other of the second conductive vias are between the second re-distribution layer and the thermal conduction structure and connected with the second re-distribution layer and the corresponding thermal conduction structure.

\* \* \* \* \*